(12) United States Patent
Hahn et al.

(10) Patent No.: US 7,820,730 B2
(45) Date of Patent: Oct. 26, 2010

(54) PERFLUOROPOLYETHER COPOLYMER COMPOSITION FOR FORMING BANKS

(75) Inventors: Jung Seok Hahn, Seongnam-si (KR); Kyu Yeol In, Uiwang-si (KR); Bon Won Koo, Suwon-si (KR); Kook Min Han, Suwon-si (KR); Sang-Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 439 days.

(21) Appl. No.: 11/710,489

(22) Filed: Feb. 26, 2007

(65) Prior Publication Data

US 2008/0078990 A1    Apr. 3, 2008

(30) Foreign Application Priority Data

Sep. 29, 2006    (KR)    ............... 10-2006-0095626

(51) Int. Cl.
*C08L 71/02*    (2006.01)
*G03F 7/004*    (2006.01)

(52) U.S. Cl. .......................................... 522/6; 526/247

(58) Field of Classification Search ............... 526/247; 522/6

See application file for complete search history.

(56) References Cited

U.S. PATENT DOCUMENTS

| | | | | |
|---|---|---|---|---|
| 3,814,741 A | * | 6/1974 | Caporiccio et al. | 526/246 |
| 5,637,142 A | * | 6/1997 | Kubo et al. | 106/285 |
| 5,965,659 A | * | 10/1999 | Kubo et al. | 524/504 |
| 7,083,684 B2 | | 8/2006 | Fukuda et al. | |
| 2004/0253547 A1 | | 12/2004 | Endo et al. | |
| 2005/0194588 A1 | | 9/2005 | Sasaki et al. | |
| 2006/0147722 A1 | * | 7/2006 | Ohashi et al. | 428/421 |
| 2006/0202191 A1 | | 9/2006 | Gerlach et al. | |
| 2008/0078990 A1 | | 4/2008 | Hahn et al. | |

FOREIGN PATENT DOCUMENTS

| | | |
|---|---|---|
| EP | 1439421 A2 | 1/2004 |
| WO | WO 2005/044919 | 5/2005 |

OTHER PUBLICATIONS

Haaf, et al., "Polymers of N-Vinylpyrrolidone: Synthesis, Characterization and Uses" Polymer Journal, vol. 17, No. 1, pp. 143-152 (1985).

Hagen Klauk et al., "Contact resistance in organic thin film transistors", Solid-State Electronics 47 (2003) 297-301.

* cited by examiner

*Primary Examiner*—Kelechi C Egwim
(74) *Attorney, Agent, or Firm*—Harness, Dickey & Pierce, P.L.C.

(57) ABSTRACT

Disclosed are a copolymer of a perfluoropolyether derivative and a photosensitive polymer, a composition for forming banks comprising the copolymer, and a method for forming banks using the composition. Also disclosed is an organic thin film transistor including the composition and an electronic device including the organic thin film transistor. The use of the copolymer may enable the formation of banks by a solution coating process. Because an organic thin film transistor including banks formed by the method may be fabricated without any degradation in the characteristics of the organic thin film transistor, improved electronic properties may be exhibited.

20 Claims, 3 Drawing Sheets

PERFLUOROPOLYETHER COPOLYMER COMPOSITION FOR FORMING BANKS

PRIORITY STATEMENT

This non-provisional application claims priority under 35 U.S.C. §119 to Korean Patent Application No. 10-2006-0095626, filed on Sep. 29, 2006, in the Korean Intellectual Property Office (KIPO), the entire contents of which are herein incorporated by reference

BACKGROUND

1. Field

Example embodiments relate to a copolymer, a composition for forming banks, and a method for forming banks using the composition. Other example embodiments relate to a copolymer of a perfluoropolyether derivative and a photosensitive polymer, a composition for forming banks comprising the copolymer, and a method for forming banks using the composition.

2. Description of Related Art

In recent years, polymeric materials have attracted increased attention as electrical and electronic materials in a wide variety of applications, e.g., functional electronic devices and optical devices, because of their ease of molding into fibers and films, improved flexibility, increased conductivity and decreased production costs. Among devices using such electrically conductive polymers, organic thin film transistors may be fabricated by relatively simple techniques, e.g., printing, at decreased costs. In addition, organic thin film transistors may be advantageous in that they may be easier to process and may be highly compatible with flexible substrates. Based on these advantages, a number of studies on organic thin film transistors are being undertaken.

On the other hand, solution processing techniques, for example, printing techniques, are currently being researched due to improved processability and increased economic efficiency in the fabrication of organic electronic devices, e.g., display devices (e.g., electroluminescence devices and light-emitting diode devices). However, when a liquid material (an ink material) is filled and a thin film pattern is formed to fabricate an organic electronic device by a solution processing technique, there may arise problems that the liquid material overflows and is introduced into pixel regions of adjacent organic electronic devices, resulting in degradation of the characteristics of the adjacent organic electronic devices. To overcome these problems, banks may be formed as partition members that divide pixel regions to prevent or reduce occurrence of cross-talk between devices and to define desired regions so that an ink material may be filled only within the desired regions.

For example, when a photoresist using an organic solvent is used to form banks in the fabrication of a bottom contact type or top gate type organic thin film transistor, overflow of the organic solvent may lead to degradation of an organic insulating film, resulting in deterioration of the performance of the organic thin film transistor.

To solve these problems, many methods have been attempted. For example, one example of such a method may form banks by spin coating polyimide to form a thin film, coating a photoresist on the thin film, baking the resulting structure, followed by UV irradiation and development by photolithography to etch the polyimide. This method may additionally involve surface treatment of the banks to increase the contact angle. Other works have suggested a method for forming banks which may include spin coating a polymeric compound to form a thin film, stamping the thin film, followed by baking. This method may additionally involve surface treating the banks with plasma.

However, the disadvantage of these methods may be that when organic electronic devices are fabricated using bottom gate type insulating films, which may be general structures of display arrays, they may be exposed to organic solvents, e.g., solvents of bank materials, photoresist solvents, developing solvents and/or photoresist strippers, causing degradation in the characteristics of the devices. Because organic solvents of ink materials used to fabricate organic electronic devices have a decreased surface contact angle, the ink materials to be filled between banks may exhibit decreased definition for the banks, resulting in deteriorated performance of the devices.

SUMMARY

Therefore, example embodiments have been made in view of the problems of the prior art, and example embodiments provide a copolymer that may prevent or reduce degradation of an organic film and may ensure increased definition of an ink material to be filled between banks.

Example embodiments provide a composition for forming banks which may include the copolymer. Example embodiments provide a method for forming banks in the fabrication of an organic electronic device by a printing technique wherein pixel regions of adjacent organic electronic devices may not be adversely affected by an ink material, thus preventing or reducing deterioration of the characteristics of the adjacent organic electronic devices. Example embodiments also provide an organic thin film transistor which may include banks formed using the composition. Example embodiments provide a variety of electronic devices comprising the organic thin film transistor.

In accordance with example embodiments, there is provided a copolymer of a photosensitive polymer and a perfluoropolyether derivative of Formula 1 or 2 below:

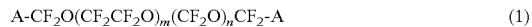

$$A\text{-}CF_2O(CF_2CF_2O)_m(CF_2O)_nCF_2\text{-}A \qquad (1)$$

wherein
each A is A' or RA',
A' is a functional group selected from the group consisting of COF, $SiX_1X_2X_3$ (in which $X_1$, $X_2$ and $X_3$ may each be independently a $C_1$-$C_{10}$ alkyl or $C_1$-$C_{10}$ alkoxy group, with the proviso that one or two of $X_1$, $X_2$ and $X_3$ may be $C_1$-$C_{10}$ alkoxy groups), silanol, chlorosilane, carboxylic acid, alcohol, amine, phosphoric acid and derivatives thereof,
R is a $C_1$-$C_{30}$ alkylene group which is unsubstituted or substituted with at least one substituent selected from the group consisting of hydroxyl, $C_1$-$C_{10}$ alkyl, hydroxyalkyl, amide, nitro, $C_2$-$C_{30}$ alkenyl, $C_1$-$C_{30}$ alkoxy and $C_2$-$C_{30}$ alkoxyalkyl groups,
m is from about 1 to about 50, and
n is from about 1 to about 50; or

$$CF_3O(CF_2CF_2O)_m(CF_2O)_nCF_2\text{-}A \qquad (2)$$

wherein A, m and n may be as defined in Formula 1.

The photosensitive polymer may be a polymer having at least one photosensitive functional group selected from the group consisting of acrylate, siloxane, imide, amide, vinyl, urethane, ester, epoxy and/or alcohol, in the backbone or side chains of the polymer.

The photosensitive polymer may be a water-soluble photosensitive polymer. Examples of water-soluble photosensitive polymers may include, but may not be limited to, polyvinyl alcohol, polyvinyl chloride, polyacrylamide, polyethylene glycol, polyethylene oxide, polymethyl vinyl ether, polyethyleneimine, polyphenylene vinylene, polyaniline, polypyrrole and/or copolymers thereof.

In accordance with example embodiments, there is provided a composition for forming banks which may include i) a photocuring agent and ii) a copolymer of a photosensitive polymer and a perfluoropolyether derivative of Formula 1 or 2 below:

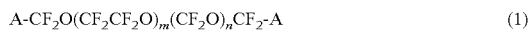
$$\text{A-CF}_2\text{O(CF}_2\text{CF}_2\text{O)}_m\text{(CF}_2\text{O)}_n\text{CF}_2\text{-A} \tag{1}$$

wherein
each A is A' or RA',

A' is a functional group selected from the group consisting of COF, $SiX_1X_2X_3$ (in which $X_1$, $X_2$ and $X_3$ may be each independently a $C_1$-$C_{10}$ alkyl or $C_1$-$C_{10}$ alkoxy group, with the proviso that one or two of $X_1$, $X_2$ and $X_3$ may be $C_1$-$C_{10}$ alkoxy groups), silanol, chlorosilane, carboxylic acid, alcohol, amine, phosphoric acid and derivatives thereof, R is a $C_1$-$C_{30}$ alkylene group which is unsubstituted or substituted with at least one substituent selected from the group consisting of hydroxyl, $C_1$-$C_{10}$ alkyl, hydroxyalkyl, amide, nitro, $C_2$-$C_{30}$ alkenyl, $C_1$-$C_{30}$ alkoxy and $C_2$-$C_{30}$ alkoxyalkyl groups, m is from about 1 to about 50, and
n is from about 1 to about 50; or

$$\text{CF}_3\text{O(CF}_2\text{CF}_2\text{O)}_m\text{(CF}_2\text{O)}_n\text{CF}_2\text{-A} \tag{2}$$

wherein A, m and n may be as defined in Formula 1.

In accordance with example embodiments, there is provided a method for forming banks which may include coating the composition to form a thin film, and patterning and developing the thin film by photolithography.

In accordance with example embodiments, there is provided an organic thin film transistor comprising a gate electrode, a gate insulating film, source/drain electrodes and an organic semiconductor layer wherein the organic thin film transistor may include banks formed using the composition.

In accordance with example embodiments, there are provided a variety of electronic devices comprising the organic thin film transistor.

BRIEF DESCRIPTION OF THE DRAWINGS

Example embodiments will be more clearly understood from the following detailed description taken in conjunction with the accompanying drawings.

FIG. 1 is a process chart schematically illustrating a method for forming banks according to example embodiments;

FIG. 2 is a schematic cross-sectional view of a bottom contact type organic thin film transistor comprising banks formed by a method according to example embodiments;

FIG. 3 is a schematic cross-sectional view of a top contact type organic thin film transistor comprising banks formed by a method according to example embodiments.

FIG. 4 is a $^1$H-NMR spectrum of a copolymer prepared in Synthesis Example 1; and FIG. 5 is a photograph showing an external shape of an organic thin film transistor comprising banks, which is fabricated in Example 1.

Figure 1:
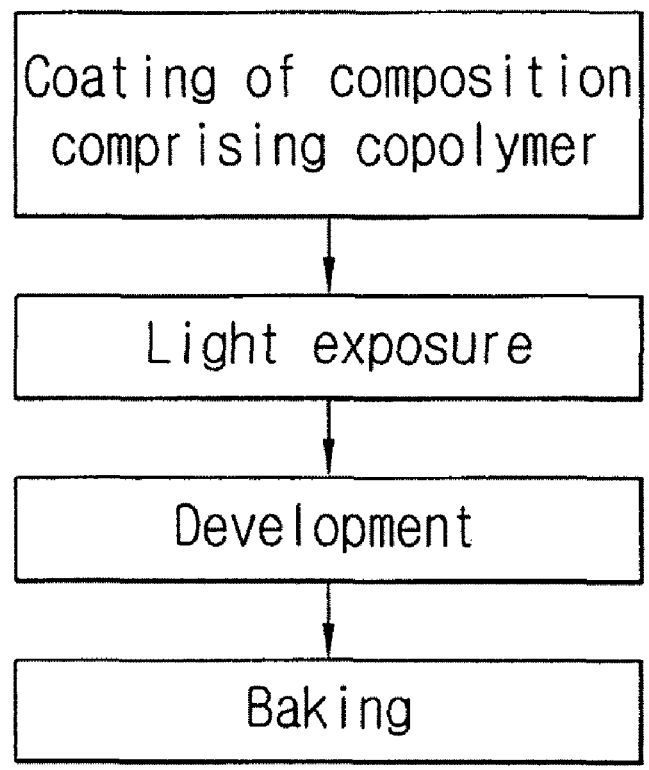
FIGS. 1-5 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described in greater detail with reference to the accompanying drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The term "photosensitive polymer" as used herein refers to a polymer having a photosensitive functional group that is decomposed or crosslinked when exposed to light, or a polymer that is mixed with a photocrosslinking agent to become a photosensitive material.

Example embodiments are directed to a copolymer of a photosensitive polymer and a perfluoropolyether derivative of Formula 1 or 2 below:

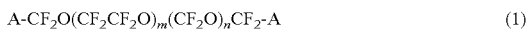

wherein
each A is A' or RA',
A' is a functional group selected from the group consisting of COF, $SiX_1X_2X_3$ (in which $X_1$, $X_2$ and $X_3$ may each be independently a $C_1$-$C_{10}$ alkyl or $C_1$-$C_{10}$ alkoxy group, with the proviso that one or two of $X_1$, $X_2$ and $X_3$ may be $C_1$-$C_{10}$ alkoxy groups), silanol, chlorosilane, carboxylic acid, alcohol, amine, phosphoric acid and derivatives thereof,
R is a $C_1$-$C_{30}$ alkylene group which is unsubstituted or substituted with at least one substituent selected from the group consisting of hydroxyl, $C_1$-$C_{10}$ alkyl, hydroxyalkyl, amide, nitro, $C_2$-$C_{30}$ alkenyl, $C_1$-$C_{30}$ alkoxy and $C_2$-$C_{30}$ alkoxyalkyl groups,
m is from about 1 to about 50, and
n is from about 1 to about 50; or

wherein A, m and n may be as defined in Formula 1.

When the copolymer is used to form banks of an organic thin film transistor, the perfluoropolyether moiety may cause the hydrophilicity of the banks to be different from that of a channel to increase the contact angle.

The perfluoropolyether derivative may have an average molecular weight of about 1,000 to about 20,000. One example of perfluoropolyether derivatives that may be represented by Formula 1 is the compound of Formula 3 below:

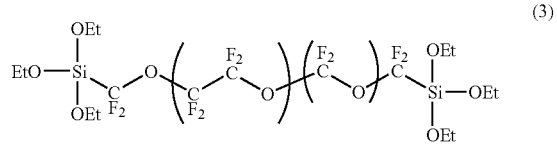

The photosensitive polymer may be a polymer having at least one photosensitive functional group in the backbone or side chains of the polymer. Any known photosensitive functional group may be introduced into the photosensitive polymer, and specific examples thereof may include acrylate, siloxane, imide, amide, vinyl, urethane, ester, epoxy and/or alcohol.

The photosensitive polymer may be a water-soluble photosensitive polymer. Specific examples of such photosensitive polymers may include, but may not be limited to, polyvinyl alcohol, polyvinyl chloride, polyacrylamide, polyethylene glycol, polyethylene oxide, polymethyl vinyl ether, polyethyleneimine, polyphenylene vinylene, polyaniline, polypyrrole and/or copolymers thereof. The photosensitive polymer may have an average molecular weight of about $5 \times 10^2$ to about $1 \times 10^6$, for example, about 20,000 to about 100,000.

The copolymer of the perfluoropolyether derivative and the photosensitive polymer may be prepared by polymerizing the perfluoropolyether derivative with the photosensitive polymer in a solvent, for example, water, in the presence of a conventional initiator.

The copolymer may be used, for example, to form banks. The copolymer may serve to lower the surface energy of a composition for forming banks, so that increased definition of an ink material to be filled between banks may be provided. Where a water-soluble polymer is used as the photosensitive polymer and water is used as a developing solvent after light exposure, the possibility of degradation of an organic film may be reduced. The water-soluble photosensitive polymer may be a polymer that has a functional group, e.g., —OH, —COOH, —NH₂ and/or —CONH₂, having a strong affinity for water, and may be dissolved in water due to the absence of crosslinkage. The use of the water-soluble photosensitive polymer may enable the formation of banks without affecting pixel regions of organic electronic devices.

The ratio of molar equivalents of the perfluoropolyether derivative to molar equivalents of the photosensitive polymer may be in the range of about 0.01:1 to about 0.2:1. When the molar equivalents of the perfluoropolyether derivative are relatively increased, the degree of crosslinking of the copolymer may be decreased. When the molar equivalents of the perfluoropolyether derivative are relatively increased, there may exist the danger that the definition may be lowered.

Example embodiments are directed to a composition for forming banks which may include i) a photocuring agent and ii) a copolymer of a photosensitive polymer and a perfluoropolyether derivative of Formula 1 or 2 below:

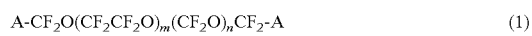

wherein
each A is A' or RA',
A' is a functional group selected from the group consisting of COF, $SiX_1X_2X_3$ (in which $X_1$, $X_2$ and $X_3$ may each be independently a $C_1$-$C_{10}$ alkyl or $C_1$-$C_{10}$ alkoxy group, with the proviso that one or two of $X_1$, $X_2$ and $X_3$ may be $C_1$-$C_{10}$ alkoxy groups), silanol, chlorosilane, carboxylic acid, alcohol, amine, phosphoric acid and derivatives thereof, R is a $C_1$-$C_{30}$ alkylene group which is unsubstituted or substituted with at least one substituent selected from the group consisting of hydroxyl, $C_1$-$C_{10}$ alkyl, hydroxyalkyl, amide, nitro, $C_2$-$C_{30}$ alkenyl, $C_1$-$C_{30}$ alkoxy and $C_2$-$C_{30}$ alkoxyalkyl groups, m is from about 1 to about 50, and n is from about 1 to about 50; or

$$CF_3O(CF_2CF_2O)_m(CF_2O)_nCF_2\text{-A} \quad (2)$$

wherein A, m and n may be as defined in Formula 1.

The photosensitive polymer may be a polymer having at least one photosensitive functional group in the backbone or side chains of the polymer. Any known photosensitive functional group may be introduced into the photosensitive polymer, and specific examples thereof may include acrylate, siloxane, imide, amide, vinyl, urethane, ester, epoxy and/or alcohol.

The photosensitive polymer may be a water-soluble photosensitive polymer. Examples of water-soluble photosensitive polymers may include, but may not be limited to, polyvinyl alcohol, polyvinyl chloride, polyacrylamide, polyethylene glycol, polyethylene oxide, polymethyl vinyl ether, polyethyleneimine, polyphenylene vinylene, polyaniline, polypyrrole and/or copolymers thereof.

The photocuring agent may function to promote the curing of banks upon UV irradiation. Examples of suitable photocuring agents that may be used in the composition of example embodiments may include, but may not be especially limited to, ammonium dichromate, pentaerythritol triacrylate, urethane acrylate and/or mixtures thereof.

The photocuring agent may be added to a solution of the copolymer in deionized water. The ratio of the photocuring agent to the copolymer dissolved in deionized water may be in the range of about 0.01:1 to about 0.05:1, for example, about 0.01:1 to about 0.04:1, based on the solids content. If necessary, a polymer compatible with the essential components of the composition or at least one additive selected from colorants, plasticizers, surfactants and/or coupling agents may be appropriately added to and blended with the composition. These additives may be added alone and/or in combination thereof.

Example embodiments are directed to a method for forming banks. According to the method of example embodiments, banks may be formed by coating the composition of example embodiments to form a thin film, and patterning and developing the thin film by photolithography. A detailed explanation of the method according to example embodiments will be provided below.

FIG. 1 is a process chart schematically illustrating a method for forming banks according to example embodiments. Referring to FIG. 1, the method of example embodiments may include coating the composition, which may include the copolymer and the photocuring agent, on a base to form a coating film, exposing the coating film to light to form a polymer film, and developing the polymer film with a developing solution to form banks. Optionally, the method may further include baking the banks.

The coating of the composition according to example embodiments to form a coating film may be performed by spin coating, dip coating, casting, microgravure coating, gravure coating, bar coating, roll coating, wire bar coating, spray coating, screen printing, flexo printing, offset printing and/or ink-jet printing. The solvent used to form the coating film including the composition may be, for example, toluene, xylene, chloroform and/or tetrahydrofuran.

After coating, the coating film may be dried, irradiated with UV light, and developed. The drying may be performed by a common process. The UV irradiation may be performed through a mask. Any light source may be used for the light exposure if the photosensitive functional group of the copolymer according to example embodiments may be photosensitized. Ultraviolet (UV) light, x rays, electronic beams, excimer laser (F2, ArF and/or KrF laser) and/or high-pressure mercury may be used as the light source. The energy required for the light exposure may be appropriately determined depending on the structure of the photosensitive functional group and the energy of the light source used. For example, the light exposure may be performed using a UV lamp having a power of about 300 W to about 500 W at a wavelength of about 340 nm to about 400 nm for about 10 seconds to about 180 seconds.

The type of developing solution used for the development may not be restricted if it provides a sufficient difference in solubility between the unexposed portions and the exposed portions. Water and/or a mixture of water and an organic solvent compatible with water may be used as a solvent capable of dissolving the unexposed portions of the photosensitive polymer. Non-limiting examples of organic solvents compatible with water may include acetone, lower alcohols (e.g., methanol), acetonitrile, and ketone-based solvents (e.g., tetrahydrofuran). A mixed solution may be used as the developing solution.

If the photosensitive polymer of the composition is a water-soluble photosensitive polymer, deionized water may be used for the development after the UV irradiation to complete the formation of banks. For example, the development may be performed using deionized water at room temperature for about one to about five minutes.

If needed, baking may be performed after the development. The baking may be performed on a hot plate at about 50° C. to about 150° C. for about 0.5 to about 2 hours, but may not be particularly limited to these conditions.

When the copolymer is used to form banks of an organic thin film transistor, the perfluoropolyether moiety may cause the hydrophilicity of the banks to be different from that of a channel to increase the contact angle.

Example embodiments are directed to an organic thin film transistor that may include a gate electrode, a gate insulating film, source/drain electrodes and an organic semiconductor layer wherein the organic thin film transistor may include banks formed using the composition. For example, the organic thin film transistor of example embodiments may be a bottom contact type and/or top gate type organic thin film transistor comprising banks formed by the method of example embodiments.

Figure 2:
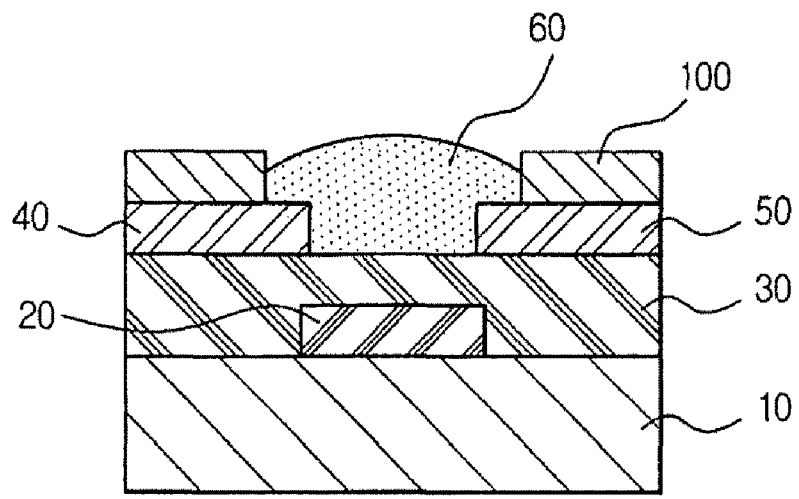

FIG. 2 is a schematic cross-sectional view of a bottom contact type organic thin film transistor comprising banks according to example embodiments. Referring to FIG. 2, the bottom contact type organic thin film transistor may include a substrate 10, a gate electrode 20 formed on the substrate, a gate insulating film 30 formed thereon, source/drain electrodes 40 and 50 formed on the gate insulating film, banks 100 formed on the source/drain electrodes, and an organic semiconductor layer 60. The organic thin film transistor of example embodiments may have a structure in which banks may be formed on source/drain electrodes, but may not be limited to this structure.

Figure 3:
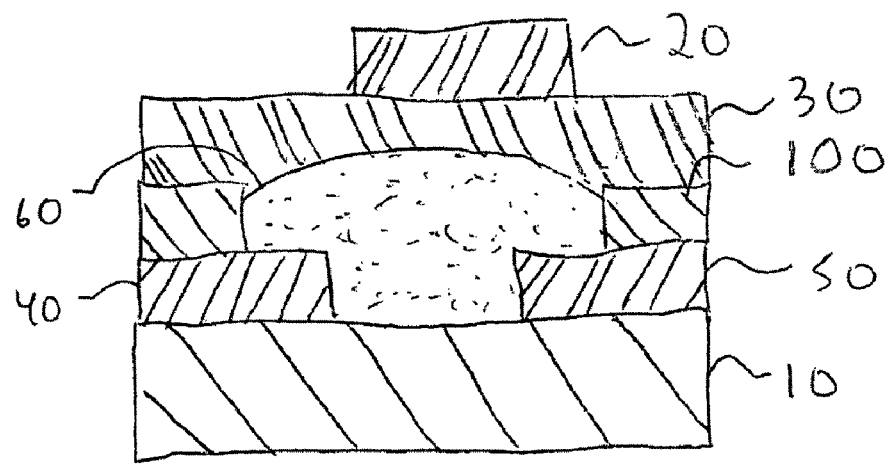

FIG. 3 is a schematic cross-sectional view of a top contact type organic thin film transistor comprising banks according to example embodiments. Referring to FIG. 3, the top gate type organic thin film transistor may include a substrate 10, source/drain electrodes 40 and 50 formed on the substrate, banks 100 formed on the source/drain electrodes, an organic semiconductor layer 60, a gate insulating film 30 formed on the organic semiconductor layer, and a gate electrode 20. A material for the substrate 10 may be selected from the group consisting of glass, silicon, and plastic, but may not be limited thereto.

A material for the gate insulating film 30 of the organic thin film transistor according to example embodiments may be selected from the group consisting of, but not limited to, polyvinyl phenol, polymethyl methacrylate, polyacrylate, polyvinyl alcohol, $SiN_x$ (0<x<4), $SiO_2$, $Al_2O_3$ and/or derivatives thereof. A material for the organic semiconductor layer 60 may be selected from the group consisting of polythiophene, polyaniline, polyacetylene, polypyrrole, polyphenylene vinylene and/or derivatives thereof, but may not be limited thereto.

Materials for the gate electrode 20, the source electrode 40 and the drain electrode 50 may be selected from the group consisting of gold (Au), silver (Ag), aluminum (Al), nickel (Ni), molybdenum (Mo), tungsten (W), indium-tin oxide (ITO), indium-zinc oxide (IZO), polythiophene, polyaniline, polyacetylene, polypyrrole, polyphenylene vinylene and/or polyethylenedioxythiophene (PEDOT)/polystyrenesulfonate (PSS) mixtures, but may not be limited thereto.

The fabrication of the organic thin film transistor according to example embodiments may be achieved by a common method. A substrate may be washed to remove impurities present therein by a common process, followed by deposition and patterning to form a gate electrode thereon. A gate insulating film may be formed on the resulting structure. The formation of the gate insulating film may be achieved by vacuum evaporation and/or solution deposition, but may not be limited thereto. If needed, the gate insulating film may be soft-baked at about 60° C. to about 150° C. for about 1 minute to about 10 minutes, or hard-baked at about 100° C. to about 200° C. for about 30 minutes to about 3 hours.

Thereafter, a source electrode and a drain electrode may be formed on the gate insulating film. Specifically, a metal and/or metal oxide may be deposited on the organic insulating film by a common thin film formation technique to form a thin film, and then the thin film may be developed by exposing regions where source and drain electrodes may be formed (or regions other than where source and drain electrodes may be formed) to light. Thereafter, etching may be performed by a common technique, and a photoresist may be removed using a photoresist stripper to form source/drain electrodes made of the metal and/or metal oxide on the organic insulating film.

Processes for the formation of the source and drain electrodes on the organic insulating film may not be especially limited, and examples thereof may include vacuum evaporation (including thermal evaporation), spin coating, roll coating, spray coating and/or printing. Banks may be formed on the source/drain electrodes in accordance with the procedure as explained above.

An organic semiconductor layer may be formed by coating an organic semiconductor material on the source/drain electrodes and the organic insulating film by a common coating technique. Coating processes for depositing an organic semiconductor material may include, but may not be limited to, thermal evaporation, screen printing, printing, spin coating, dip coating and/or ink spraying.

The organic thin film transistor of example embodiments may be used as a switching device to control the driving of a corresponding pixel and/or as a driving device of a corresponding pixel in a flat panel display device, e.g., a liquid crystal display (LCD) device and/or an electroluminescence display (ELD) device. The organic thin film transistor of example embodiments may be used in a plastic chip for a smart card and/or an inventory tag.

Hereinafter, example embodiments will be explained in more detail with reference to the following examples. However, these examples may be given for the purpose of illustration only and are not intended to limit example embodiments.

EXAMPLES

Synthesis Example 1

Synthesis of Copolymers

Figure 4:
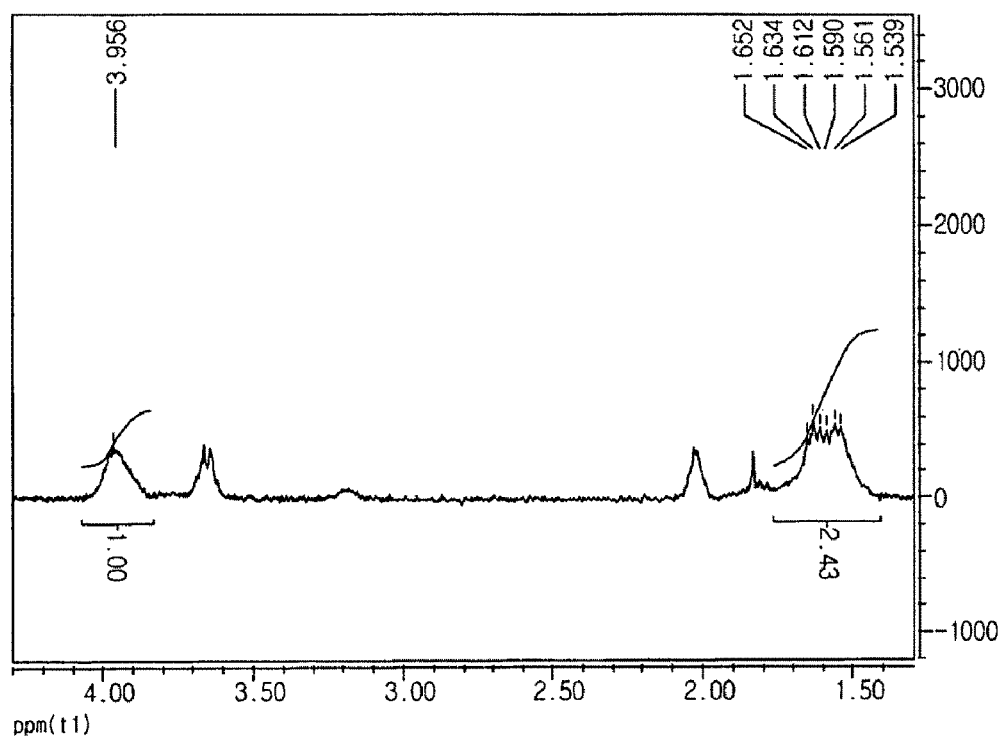

As depicted in Reaction 1, PFPE-Si(OEt)$_3$ of Formula 3 was mixed with polyvinyl alcohol (#2000, Kanto Chemical Co.) as a photosensitive polymer in accordance with the compositions shown in Table 1. The mixtures were stirred and extracted with a fluorinated organic solvent (Vertrel XF®, DuPont). The obtained extracts were washed to give copolymers. The structure of the copolymers was identified by 1H-NMR spectroscopy. FIG. 4 shows the $^1$H-NMR spectrum of the copolymer in which the ratio of molar equivalents of the PFPE-Si(OEt)$_3$ to the molar equivalents of the photosensitive polymer was about 0.05:1. The ratio of the number of hydrogen atoms contained in the hydroxyl groups to the number of secondary hydrogen atoms contained in the aliphatic chain was about 1:2.04 in pure polyvinyl alcohol, while the ratio was about 1:2.43 in the copolymer, which is apparent from the spectrum of FIG. 4. These results indicate that some hydroxyl groups of the polyvinyl alcohol were substituted after the copolymerization.

Reaction 1

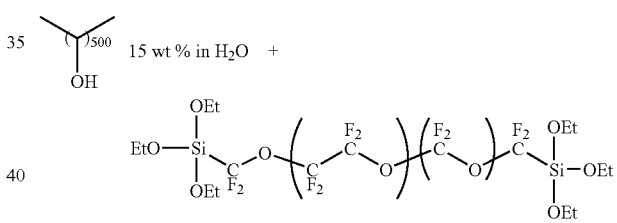

Example 1

A glass substrate was cleaned, and aluminum (Al) was deposited thereon by a sputtering technique to form a gate electrode having a thickness of about 1,500 Å. An organic gate insulating film was formed to a thickness of about 4,000 Å on the gate electrode and the glass substrate by spin coating at about 2,000 rpm, followed by sequential baking at about 70° C. for about 20 minutes and about 200° C. for about 2 hours. Au was deposited on the gate insulating film to a thickness of about 700 Å by a thermal evaporation method, and was then subjected to a photolithographic process to form an Au electrode pattern. The deposition was conducted under a vacuum pressure of about 2×10$^{-7}$ torr and a deposition rate of about 5 Å/sec.

Subsequently, banks were formed on the Au electrodes in accordance with the following procedure. Ammonium dichromate (Sigma Aldrich) was added to an about 5 wt % solution of each of the PFPE-polyvinyl alcohol copolymers in deionized water to prepare a coating solution. The ratio of the ammonium dichromate to the copolymer was about 0.01:1, based on the solids content. The coating solution was spin-coated on the Au electrodes and dried. The surface of the dried coating was irradiated using a UV lamp with a power of about 400 W/cm³ at a wavelength of about 340 nm to about 400 nm for about 20 seconds, developed using deionized water at room temperature for about 3 minutes, and baked on a hot plate at about 150° C. for about 30 minutes to form banks on the Au electrodes. Thereafter, polythiophene as a semiconductor material was coated on the Au electrodes and the gate insulating film by an ink spraying technique to form an organic semiconductor active layer, completing the fabrication of organic thin film transistors. The characteristics of the organic thin film transistors were evaluated, and the results are shown in Table 1.

To evaluate whether the organic thin film transistors of example embodiments could control the contact angles, the channel contact angles with the surface of the gate insulating films of the organic thin film transistors fabricated in Example 1 and the contact angles with the surface of the banks were measured. The results are shown in Table 1. The contact angles were determined by advancing angle measurement using a single drop of distilled water.

TABLE 1

| Ratio of molar equivalents of PFPE to molar equivalents of PVA | Formation of pattern | Contact angle with banks | Contact angle with channel |
|---|---|---|---|
| 0.001:1 | Observed | 56.3 | 52.4 |
| 0.01:1 | Observed | 61.2 | 53.7 |
| 0.05:1 | Observed | 96.6 | 52.1 |
| 0.3:1 | Not observed | N/A | — |

As may be seen from the results given in Table 1, the organic thin film transistors of example embodiments may cause the hydrophilicity of the banks to be different from that of the channels, resulting in increased contact angles.

Experimental Example 1

Figure 5:
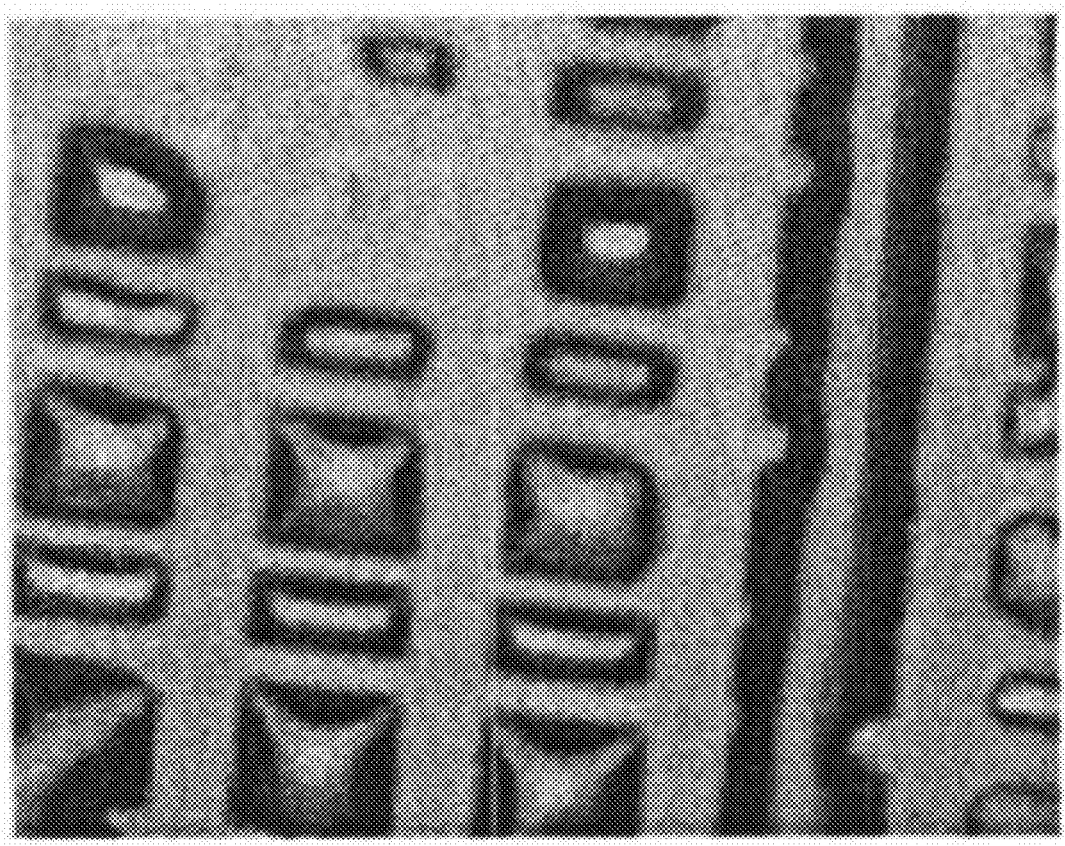

To evaluate the patternability of banks formed by the method of example embodiments, the size of the banks formed in Example 1 was measured using a confocal laser scanning microscope (OLYMPUS LEXT OLS3000). The results are shown in FIG. 5.

As apparent from the foregoing, the composition for forming banks according to example embodiments may include a copolymer of a perfluoropolyether derivative as a fluorinated surface modifier and a photosensitive polymer. Because the copolymer serves to minimize or reduce the surface energy of the composition, an ink material to be filled between banks may exhibit increased definition for the banks despite a decreased surface contact angle of an organic solvent of the ink material.

The use of a water-soluble photosensitive polymer, not having an influence on an organic insulating film, may enable the prevention or reduction of deterioration in the performance of an organic thin film transistor.

Where a simple mixture of a water-solubilized active fluorinated material and a photosensitive polymeric material is used to form a pattern, fine residual films may remain on the pattern, resulting in deterioration of the characteristics of the pattern. In contrast, the use of the copolymer of an active perfluoropolyether derivative and a photosensitive polymer according to example embodiments may leave no fine residual film.

Although the example embodiments have been disclosed for illustrative purposes, those skilled in the art will appreciate that various modifications and variations may be possible, without departing from the scope and spirit of example embodiments as disclosed in the appended claims. Accordingly, such modifications and variations may be intended to come within the scope of the claims.

What is claimed is:

1. A copolymer of a photosensitive polymer and a perfluoropolyether derivative of Formula 1 or 2 below:

$$A\text{-}CF_2O(CF_2CF_2O)_m(CF_2O)_nCF_2\text{-}A \quad (1)$$

wherein
each A is a functional group selected from the group consisting of COF, $SiX_1X_2X_3$ (in which $X_1$, $X_2$ and $X_3$ may be each independently a $C_1$-$C_{10}$ alkyl or $C_1$-$C_{10}$ alkoxy group, with the proviso that one or two of $X_1$, $X_2$ and $X_3$ may be $C_1$-$C_{10}$ alkoxy groups), silanol, chlorosilane, phosphoric acid and derivatives thereof,
m is from about 1 to about 50, and
n is from about 1 to about 50; or $$CF_3O(CF_2CF_2O)_m(CF_2O)_nCF_2\text{-}A \quad (2)$$

wherein A, m and n are as defined in Formula 1.

2. The copolymer according to claim 1, wherein the photosensitive polymer is a polymer having at least one photosensitive functional group selected from the group consisting of acrylate, siloxane, imide, amide, vinyl, urethane, ester, epoxy and alcohol in the backbone or side chains of the polymer.

3. The copolymer according to claim 1, wherein the photosensitive polymer is a water-soluble photosensitive polymer.

4. The copolymer according to claim 3, wherein the water-soluble photosensitive polymer is selected from the group consisting of polyvinyl alcohol, polyvinyl chloride, polyacrylamide, polyethylene glycol, polyethylene oxide, polymethyl vinyl ether, polyethyleneimine, polyphenylene vinylene, polyaniline, polypyrrole, and copolymers thereof.

5. The copolymer according to claim 1, wherein the perfluoropolyether derivative has a average molecular weight of about 1,000 to about 20,000.

6. The copolymer according to claim 1, wherein the ratio of molar equivalents of the perfluoropolyether derivative to molar equivalents of the photosensitive polymer is in the range of about 0.01:1 to about 0.2:1.

7. A composition for forming banks, the composition comprising i) a photocuring agent and ii) the copolymer of a photosensitive polymer and a perfluoropolyether derivative of Formula 1 or 2 according to claim 1.

8. The composition according to claim 7, wherein the photosensitive polymer is a polymer having at least one photosensitive functional group selected from the group consisting of acrylate, siloxane, imide, amide, vinyl, urethane, ester, epoxy and alcohol in the backbone or side chains of the polymer.

9. The composition according to claim 8, wherein the photosensitive polymer is a water-soluble photosensitive polymer.

10. The composition according to claim 9, wherein the water-soluble photosensitive polymer is selected from the group consisting of polyvinyl alcohol, polyvinyl chloride, polyacrylamide, polyethylene glycol, polyethylene oxide, polymethyl vinyl ether, polyethyleneimine, polyphenylene vinylene, polyaniline, polypyrrole, and copolymers thereof.

11. The composition according to claim 7, wherein the ratio of molar equivalents of the perfluoropolyether derivative to molar equivalents of the photosensitive polymer is in the range of about 0.01:1 to about 0.2:1.

12. The composition according to claim 7, wherein the ratio of the photocuring agent to the copolymer is in the range of about 0.01:1 to about 0.05:1, based on the solids content.

13. The composition according to claim 7, wherein the photocuring agent is selected from the group consisting of ammonium dichromate, pentaerythritol triacrylate, urethane acrylate, and mixtures thereof.

14. A method for forming banks, the method comprising:
coating a composition for forming banks to form a thin film, the composition comprising i) a photocuring agent and the copolymer of a photosensitive polymer and a perfluoropolyether derivative of Formula 1 or 2 below:

$$A\text{-}CF_2O(CF_2CF_2O)_m(CF_2O)_nCF_2\text{-}A \quad (1)$$

wherein
each A is a functional group selected from the group consisting of COF, $SiX_1X_2X_3$ (in which $X_1$, $X_2$ and $X_3$ may be each independently a $C_1$-$C_{10}$ alkyl or $C_1$-$C_{10}$ alkoxy group, with the proviso that one or two of $X_1$, $X_2$ and $X_3$ may be $C_1$-$C_{10}$ alkoxy groups), silanol, chlorosilane, phosphoric acid and derivatives thereof,
m is from about 1 to about 50, and
n is from about 1 to about 50; or $$CF_3O(CF_2CF_2O)_m(CF_2O)_nCF_2\text{-}A \quad (2)$$

wherein A, m and n are as defined in Formula 1; and
patterning and developing the thin film by photolithography.

15. The method according to claim 14, wherein the coating is performed by spin coating, dip coating, casting, microgravure coating, gravure coating, bar coating, roll coating, wire bar coating, spray coating, screen printing, flexo printing, offset printing, or ink jet printing.

16. The method according to claim 14, wherein the development is performed using deionized water at room temperature for about one to about five minutes.

17. An organic thin film transistor comprising a gate electrode, a gate insulating film, source/drain electrodes and an organic semiconductor layer wherein the organic thin film transistor includes banks formed using the composition according to claim 7.

18. The organic thin film transistor according to claim 17, wherein the banks are formed on the source/drain electrodes.

19. The organic thin film transistor according to claim 17, wherein the organic thin film transistor has a bottom contact or top gate structure.

20. An electronic device comprising the organic thin film transistor according to claim 17.

* * * * *